(12) United States Patent
Hou et al.

(10) Patent No.: US 12,408,260 B2
(45) Date of Patent: Sep. 2, 2025

(54) NETWORK COMMUNICATION DEVICE HAVING ELECTROMAGNETIC SHIELDING FUNCTION

(71) Applicant: Sercomm Corporation, Taipei (TW)

(72) Inventors: Yujian Hou, Jiangsu (CN); Liang Li, Jiangsu (CN); Tianjiao Huang, Jiangsu (CN)

(73) Assignee: Sercomm Corporation, Taipei (TW)

( * ) Notice: Subject to any disclaimer, the term of this patent is extended or adjusted under 35 U.S.C. 154(b) by 248 days.

(21) Appl. No.: 18/333,568

(22) Filed: Jun. 13, 2023

(65) Prior Publication Data

US 2023/0413419 A1 Dec. 21, 2023

(30) Foreign Application Priority Data

Jun. 16, 2022 (CN) .......................... 202210682091.6

(51) Int. Cl.
*H05K 1/02* (2006.01)

(52) U.S. Cl.
CPC ......... *H05K 1/0224* (2013.01); *H05K 1/0203* (2013.01); *H05K 1/023* (2013.01); *H05K 2201/10098* (2013.01); *H05K 2201/10734* (2013.01); *H05K 2201/10984* (2013.01)

(58) Field of Classification Search
CPC ...... H05K 1/0203–0212; H05K 1/0216–0224; H05K 1/023; H05K 2201/10098; H05K 2201/10734; H05K 2201/10984; H01L 23/562;

(Continued)

(56) References Cited

U.S. PATENT DOCUMENTS

| 5,625,224 A * | 4/1997 | Greenwood ...... H01L 23/49816 257/E21.511 |
| 6,268,568 B1 * | 7/2001 | Kim ..................... H05K 3/3436 174/250 |

(Continued)

FOREIGN PATENT DOCUMENTS

| CN | 1409942 | 4/2003 |
| CN | 2804954 | 8/2006 |

(Continued)

OTHER PUBLICATIONS

JP-2007180682-A English Translation (Year: 2007).*
"Office Action of China Counterpart Application", issued on Aug. 26, 2024, p. 1-p. 13.

*Primary Examiner* — Amir A Jalali
(74) *Attorney, Agent, or Firm* — JCIPRNET

(57) ABSTRACT

A network communication device has a circuit board, a network communication chip, an antenna, and a metal cover. The circuit board has a first surface and a second surface opposite to each other. An interior of the circuit board has a ground layer. An edge of the first surface has a ground ring. The ground ring surrounds the first surface and is electrically connected to the ground layer. The network communication chip is disposed on the first surface. The antenna is electrically connected to the circuit board. The metal cover has an annular support rib. The circuit board is disposed on the annular support rib with the first surface facing the metal cover. The ground ring is in physical contact with and electrically connected to the annular support rib.

11 Claims, 8 Drawing Sheets

(58) Field of Classification Search
CPC .......... H01L 23/49894; H01L 23/3142; H01L 23/40816; H01L 23/49866; H04R 1/1083
See application file for complete search history.

(56) References Cited

U.S. PATENT DOCUMENTS

| | | | | |
|---|---|---|---|---|
| 7,309,647 | B1* | 12/2007 | Nguyen | H05K 3/3463 |
| | | | | 257/772 |
| 10,090,282 | B1* | 10/2018 | Kinsley | H01L 25/0657 |
| 2004/0074950 | A1* | 4/2004 | Grieder | H05K 3/3436 |
| | | | | 228/246 |
| 2004/0110366 | A1* | 6/2004 | MacKay | H01L 24/13 |
| | | | | 228/248.1 |
| 2004/0142721 | A1* | 7/2004 | Kim | H04M 1/0283 |
| | | | | 455/575.3 |
| 2004/0233648 | A1* | 11/2004 | Ajioka | H01L 24/29 |
| | | | | 361/752 |
| 2005/0017372 | A1* | 1/2005 | Lua | H01L 24/05 |
| | | | | 257/E21.511 |
| 2005/0146390 | A1* | 7/2005 | Baek | H05K 1/116 |
| | | | | 333/33 |
| 2005/0150936 | A1* | 7/2005 | Mackay | B23K 3/087 |
| | | | | 438/615 |
| 2011/0163919 | A1 | 7/2011 | Suzuki | |
| 2017/0033442 | A1* | 2/2017 | Choi | G06F 3/044 |
| 2018/0286833 | A1* | 10/2018 | Khalaf | H01L 25/50 |
| 2019/0191597 | A1* | 6/2019 | Han | H01Q 21/0087 |
| 2021/0153340 | A1* | 5/2021 | Lee | G06F 1/182 |
| 2022/0141950 | A1* | 5/2022 | Wang | H01L 23/3128 |
| | | | | 174/350 |

FOREIGN PATENT DOCUMENTS

| | | |
|---|---|---|
| CN | 202917625 | 5/2013 |
| CN | 103930309 | 7/2014 |
| CN | 205566790 | 9/2016 |
| CN | 206559718 | 10/2017 |
| CN | 108141996 | 10/2020 |
| CN | 111816629 | 10/2020 |
| CN | 215991337 | 3/2022 |
| JP | 2007180682 A * | 7/2007 |

* cited by examiner

NETWORK COMMUNICATION DEVICE HAVING ELECTROMAGNETIC SHIELDING FUNCTION

CROSS-REFERENCE TO RELATED APPLICATION

This application claims the priority benefit of China application serial no. 202210682091.6, filed on Jun. 16, 2022. The entirety of the above-mentioned patent application is hereby incorporated by reference herein and made a part of this specification.

BACKGROUND

Technical Field

The disclosure relates to a network communication device, in particular to a network communication device having an electromagnetic shielding function.

Description of Related Art

With the advancement of technology, the number of connected components on the circuit board has increased, and the transmission performance has also improved day by day. However, the fast operating performance is likely to generate electromagnetic waves and affect the operation of other electronic components. For example, an antenna connected to a circuit board is susceptible to electromagnetic interference from other electronic components, which may affect signal reception. In the related art, metal shields are mostly used to shield the network communication chip to shield electromagnetic waves, but the shielding effect is still limited. How to design a simple shield to shield electromagnetic waves well and maintain the operating performance of electronic components is a direction that persons skilled in the art are devoting to research and develop.

SUMMARY

The disclosure is a network communication device having an electromagnetic shielding function, which can improve the effectiveness of the antenna for receiving signals.

According to an embodiment of the disclosure, a network communication device includes a circuit board, a network communication chip, an antenna, and a first metal cover. The circuit board has a first surface and a second surface opposite to each other. An interior of the circuit board has a ground layer. An edge of the first surface has a ground ring. The ground ring surrounds the first surface and is electrically connected to the ground layer. The network communication chip is disposed on the first surface. The antenna is electrically connected to the circuit board. The first metal cover has an annular support rib. The circuit board is disposed on the annular support rib with the first surface facing the first metal cover. The ground ring is in physical contact with and electrically connected to the annular support rib.

According to an embodiment of the disclosure, the first metal cover further has a retaining wall, and the annular support rib and a contact surface of the ground ring are shielded by the retaining wall when viewed along a direction parallel to the first surface.

According to an embodiment of the disclosure, the circuit board further includes a plurality of solder balls. The plurality of solder balls are arranged in a staggered manner on the ground ring and connected to the ground ring.

According to an embodiment of the disclosure, diameters of the plurality of solder balls respectively range from 11 mils to 13 mils.

According to an embodiment of the disclosure, spacings between the plurality of solder balls respectively range from 9 mils to 11 mils.

According to an embodiment of the disclosure, the network communication device further includes a second metal cover assembled with the first metal cover, in which the circuit board is disposed between the first metal cover and the second metal cover, and the antenna is positioned outside the first metal cover and the second metal cover.

According to an embodiment of the disclosure, the first metal cover and the second metal cover are entirely made of metal.

According to an embodiment of the disclosure, the ground layer is electrically connected to the ground ring through a plurality of plated through holes.

According to an embodiment of the disclosure, the network communication device further includes an electromagnetic wave shielding cover disposed on the first surface and covering the network communication chip. The first metal cover further has a heat dissipation portion, and the heat dissipation portion is in thermal contact with the electromagnetic wave shielding cover.

According to an embodiment of the disclosure, the circuit board further includes a connection port, in which a metal shell of the connection port is in physical contact with and electrically connected to the annular support rib.

According to an embodiment of the disclosure, the first surface also has a bare metal layer, the first metal cover further has a heat dissipation portion, the heat dissipation portion is in thermal contact with the bare metal layer, and the bare metal layer is electrically connected to the ground layer.

According to an embodiment of the disclosure, a width of the ground ring is greater than or equal to 1.5 mm.

Based on the above, in the network communication device of the disclosure, the first metal cover and the circuit board can effectively shield electromagnetic waves generated by the network communication chip, so that the antenna can receive external signals well.

DESCRIPTION OF THE EMBODIMENTS

Figure 1A:
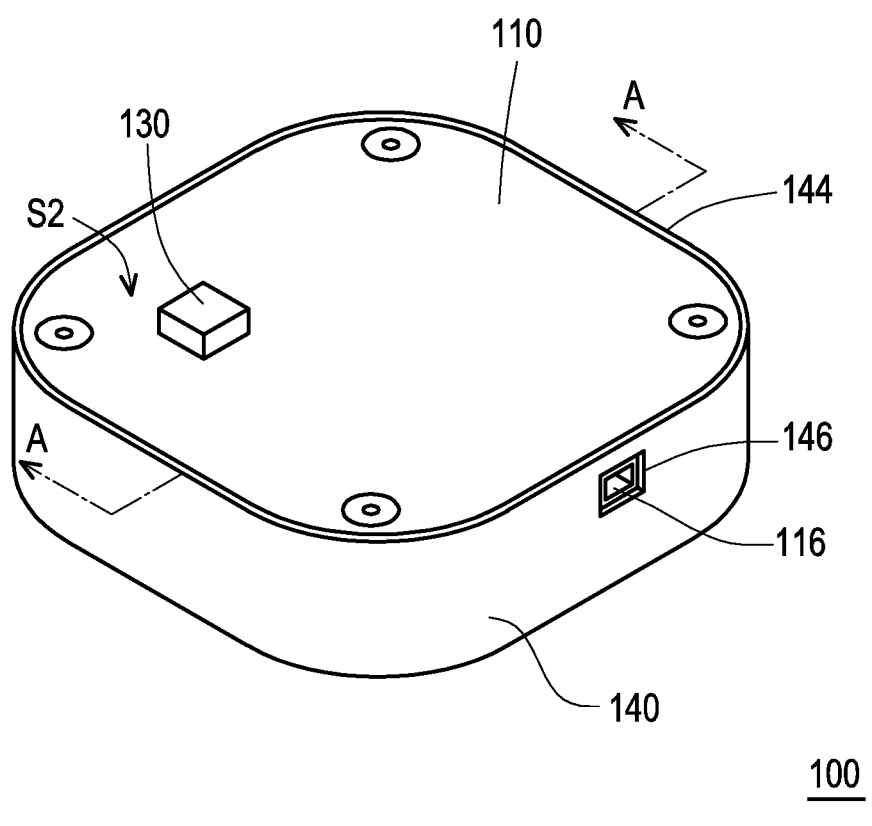
FIG. 1A is a schematic view of a network communication device according to an embodiment of the disclosure.

Reference will now be made in detail to the exemplary embodiments of the disclosure, examples of which are illustrated in the accompanying drawings. Wherever possible, the same reference numerals will be used in the drawings and description to refer to the same or like parts.

The network communication devices of the various embodiments of the disclosure are, for example, wireless access points using 6 GHz unlicensed frequency bands, indoor millimeter wave wireless communication devices, intelligent 10 Gigabit optical fiber routers based on deep message detection, and high-definition large-screen smart phone conference devices based on Android systems, gigabit mobile access routers supporting mobile app management, but the disclosure is not limited thereto. In addition, the network communication device of the disclosure may be equipped with various forms of appearance parts and other components according to requirements, and the disclosure is not limited thereto.

Figure 1B:
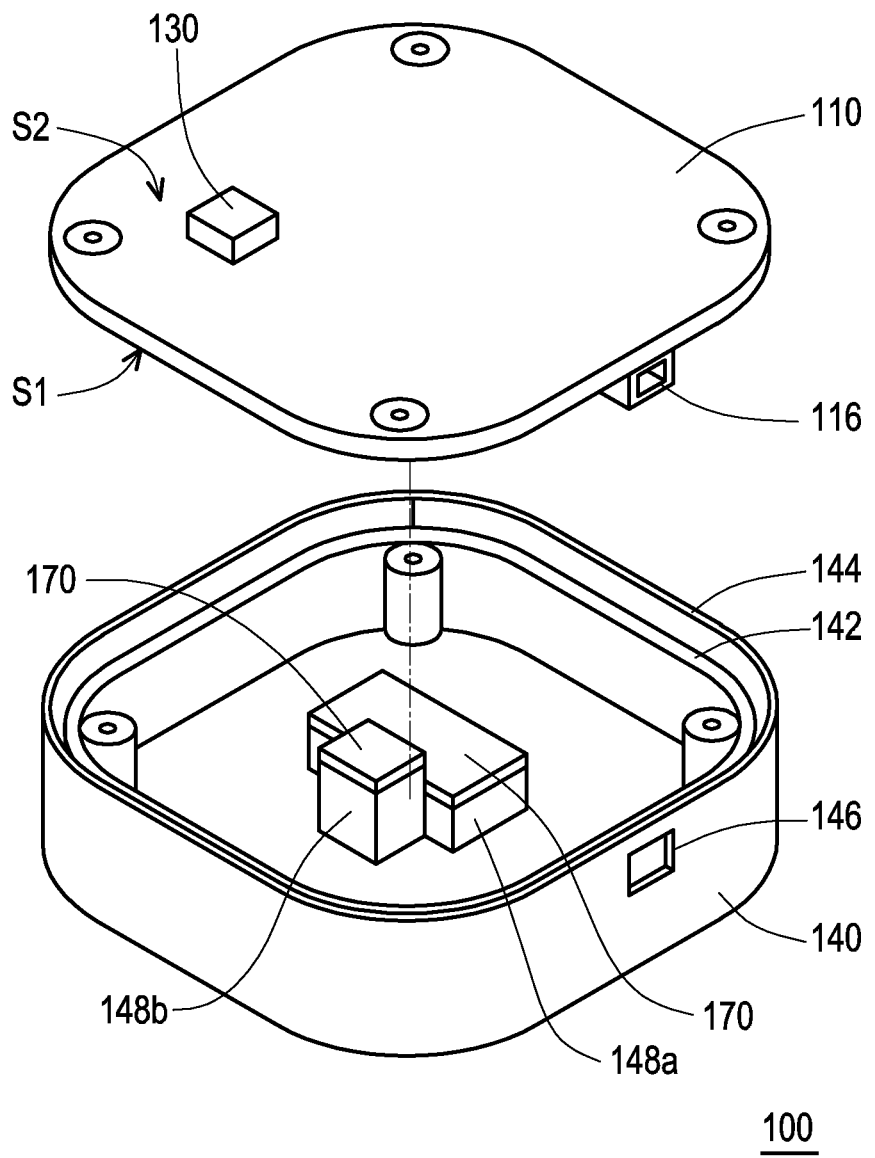
FIG. 1B is a schematic exploded view of the network communication device in FIG. 1A.
Figure 2A:
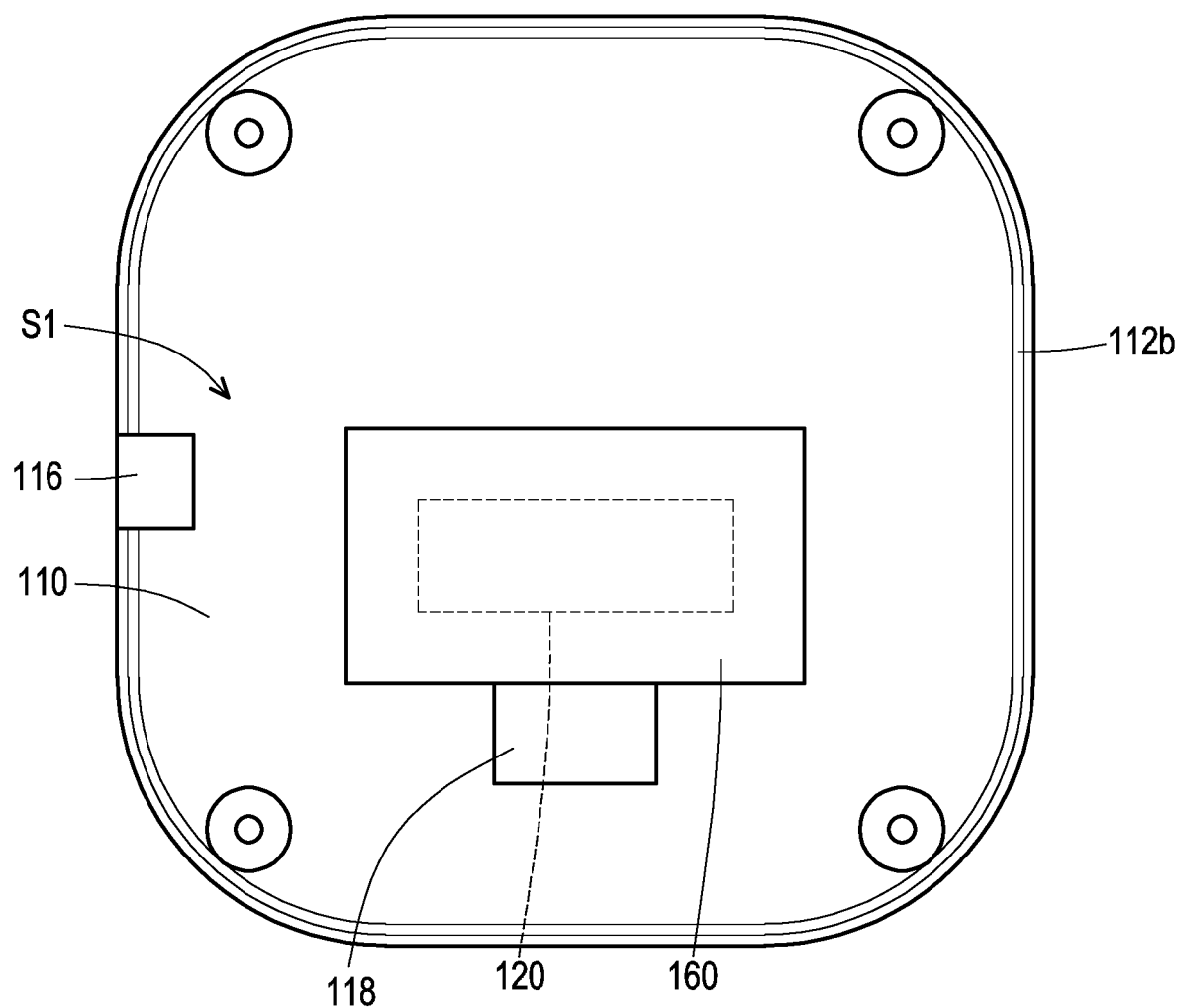
FIG. 2A is a bottom view of the circuit board of the network communication device in FIG. 1B.

FIG. 1A is a schematic view of a network communication device according to an embodiment of the disclosure. FIG. 1B is a schematic exploded view of the network communication device in FIG. 1A. FIG. 2A is a bottom view of the circuit board of the network communication device in FIG. 1B. Please refer to FIG. 1A to FIG. 2A. A network communication device 100 of this embodiment includes a circuit board 110, a network communication chip 120, and an antenna 130. The circuit board 110 has a first surface S1 and a second surface S2 opposite to each other, and an edge of the first surface S1 of the circuit board 110 has a ground ring 112b. An interior of the circuit board 110 has a ground layer 112a, the ground layer 112a is positioned between the first surface S1 and the second surface S2, and the ground ring 112b of the circuit board 110 surrounds the first surface S1 and is electrically connected to the ground layer 112a. The antenna 130 is electrically connected to the circuit board 110. The network communication chip 120 is disposed on the first surface S1 of the circuit board 110. The network communication chip 120 is, for example, a chip such as an RF chip, a transceiver chip, a baseband chip, a System on a Chip, and the kind of network communication chip 120 of the disclosure is not limited. For example, the ground ring 112b surrounds the network communication chip 120.

Figure 2B:
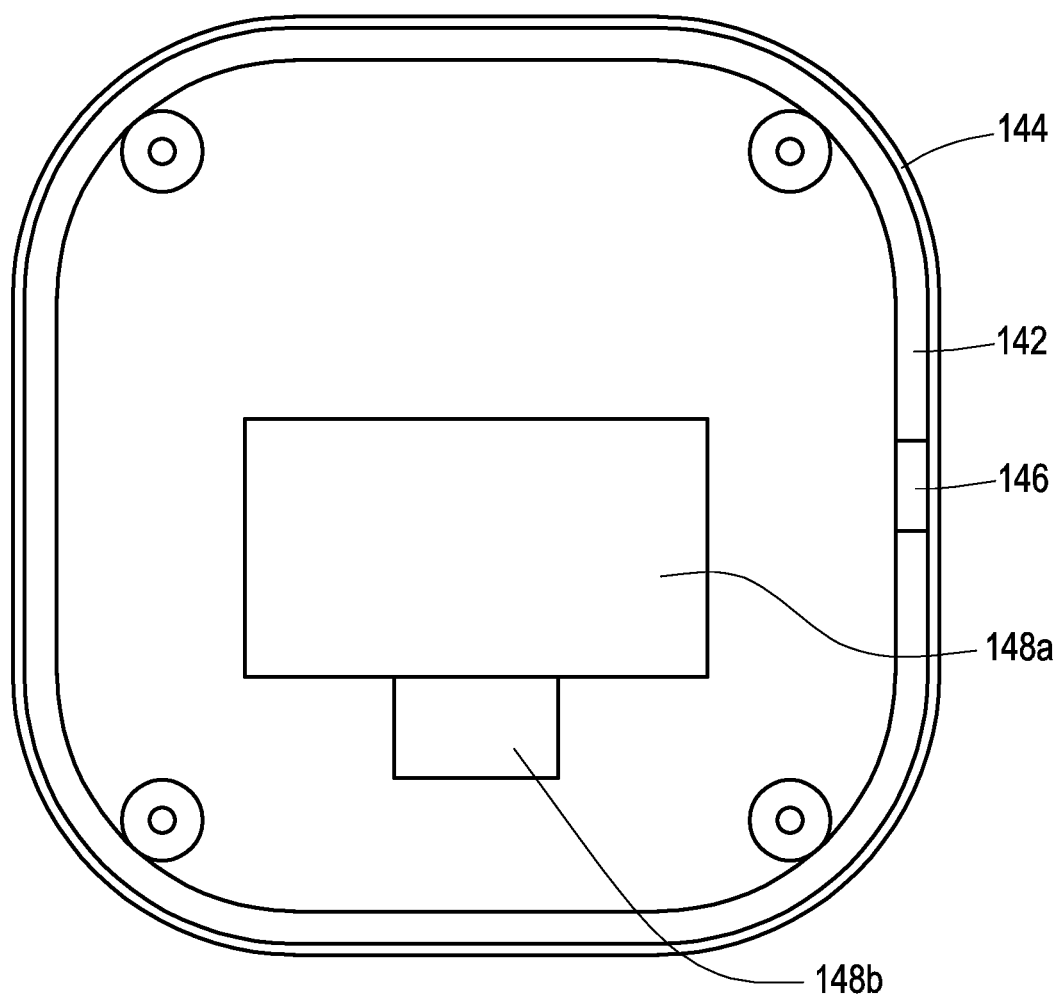
FIG. 2B is a top view of the first metal cover of the network communication device in FIG. 1B.

FIG. 2B is a top view of the first metal cover of the network communication device in FIG. 1B. Please refer to FIG. 1A, FIG. 1B, and FIG. 2B. The network communication device 100 of this embodiment includes a first metal cover 140, and the first metal cover 140 has an annular support rib 142. When the circuit board 110 is assembled on the first metal cover 140, the circuit board 110 is disposed on the annular support rib 142 with the first surface S1 facing the first metal cover 140. The ground ring 112b is in physical contact with and electrically connected to the annular support rib 142, that is, a current may flow in between.

According to the above, the ground layer 112a of the circuit board 110 is electrically connected to the annular support rib 142 of the first metal cover 140 through the ground ring 112b, and the first metal cover 140 and the circuit board 110 seal the network communication chip 120 in a space formed by the first metal cover 140 and the circuit board 110. The ground layer 112a is substantially spread over all or most areas of the circuit board 110, so any area of the circuit board 110 where electromagnetic waves arrive is received by the ground layer 112a. In addition, any area of the first metal cover 140 where the electromagnetic waves arrive is also received. The first metal cover 140 is connected to the ground layer 112a through the ground ring 112b to form a common ground. Such a design allows the first metal cover 140 and the ground layer 112a of the circuit board 110 to jointly form a shielding chamber to shield electromagnetic waves generated during an operation process of the network communication chip 120, so that the electromagnetic waves cannot radiate from the shielding chamber to outside, and external electromagnetic waves cannot enter the shielding chamber. Moreover, the network communication device 100 of this embodiment only needs to dispose electrical connection to the ground ring 112b of the ground layer 112a on the circuit board 110, and the effect of electromagnetic shielding can be achieved with the first metal cover 140. That is to say, the manufacturing cost of the network communication device 100 of this embodiment is low and the structure is simple. In this embodiment, when assembling the network communication device 100, only the ground ring 112b needs to be in physical contact with the annular support rib 142, and no clamping structure or adhesive is required between the ground ring 112b and the annular support rib 142 to connect the ground ring 112b and the annular support rib 142. The process is fast and convenient, and the disassembling in the future is also convenient. In other embodiments, the network communication device 100 may also use appropriate fastening structures, locking structures, or adhesives to respectively fix each component of the network communication device 100.

In the embodiment of the disclosure, the antenna 130 is disposed on the second surface S2 of the circuit board 110 and exposed outside the space formed by the first metal cover 140 and the circuit board 110. That is to say, the network communication chip 120 and the antenna 130 are respectively disposed on two opposite surfaces of the circuit board 110. At this time, since electromagnetic waves of the network communication chip 120 is shielded by the first metal cover 140 and the circuit board 110, the reception of the antenna 130 is less likely to be influenced by the electromagnetic waves, and external signals can be received well. The first metal cover 140 may be combined with another cover to form a housing of the network communication device 100. The antenna 130 may be positioned in a space in the housing but outside the shielding chamber, such as on the second surface S2 or a space between the second surface S2 and another cover, or may also be an external antenna disposed at an outer side of the housing. Also, the first metal cover 140 may not be positioned at an outer side of the network communication device 100, but the components shown in FIG. 1B are covered by the unshown housing.

In addition, other components that are likely to generate electromagnetic waves may also be disposed on the first surface S1 of the circuit board 110, so that these components are positioned in the conductive shielding chamber formed by the ground layer 112a and the first metal cover 140, so as to shield electromagnetic waves generated during an operation process of the components without radiating to the outside. On the other hand, components that are less likely to generate electromagnetic waves may be disposed on the second surface S2 of the circuit board 110.

Figure 3:
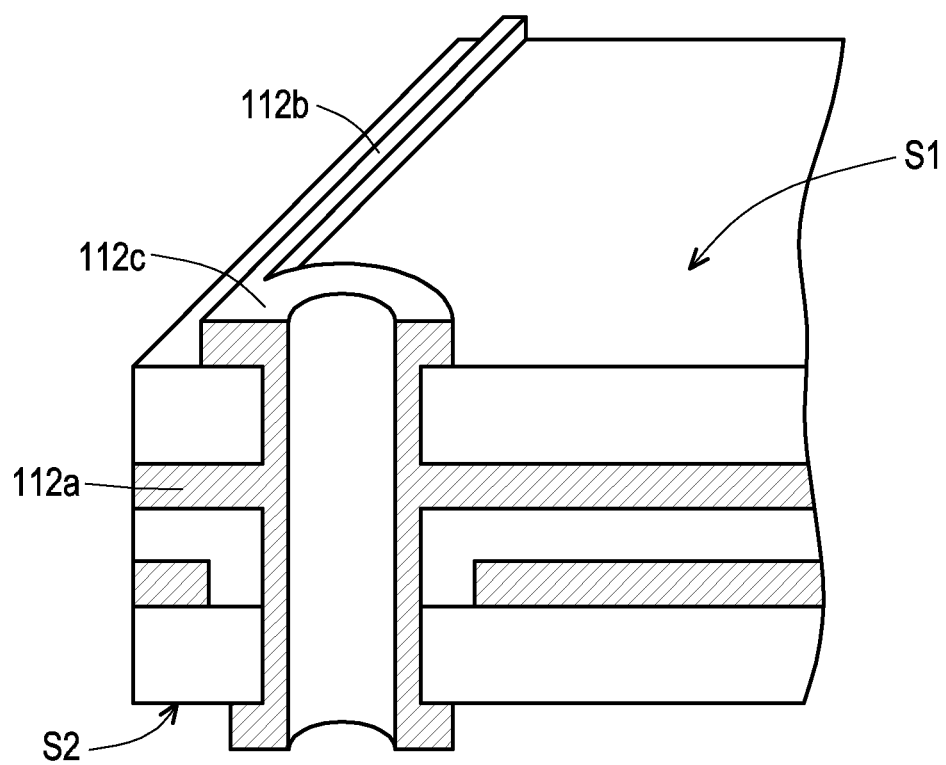
FIG. 3 is a partially enlarged cross-sectional view of the circuit board in FIG. 2A.

FIG. 3 is a partially enlarged cross-sectional view of the circuit board in FIG. 2A. For convenience of illustration, the sizes of the ground layer 112a, the ground ring 112b, and a plated through hole 112c in FIG. 3 are all enlarged, but are not used to represent the actual size. Referring to FIG. 3, in an embodiment of the disclosure, the ground layer 112a is electrically connected to the ground ring 112b through a plurality of plated through holes 112c. The first metal cover 140 may be entirely made of metal. Through the above design, when the annular support rib 142 of the first metal cover 140 is in physical contact with the ground ring 112b of the circuit board 110, the ground layer 112a and the first metal cover 140 form a conductive shielding chamber, so that the electromagnetic waves of the network communication chip 120 on the circuit board 110 does not affect the antenna 130, and the external electromagnetic waves does not affect the network communication chip 120. In other embodiments, the first metal cover 140 may be partially made of non-metal, as long as the metal components may be distributed in most areas and conduct with each other to shield electromagnetic waves, the disclosure is not limited thereto.

Figure 5A:
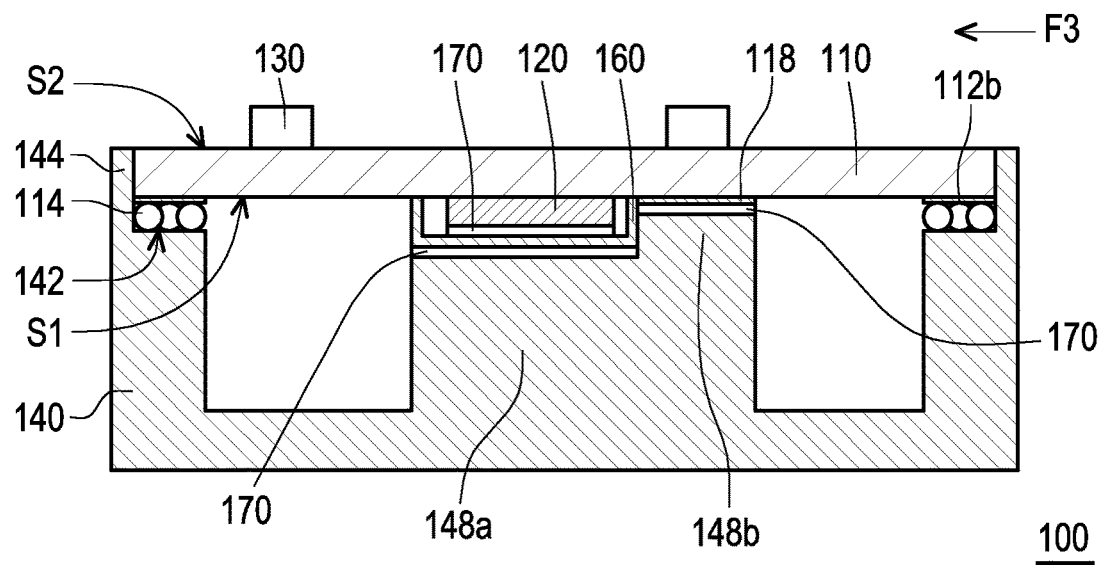
FIG. 5A is a schematic cross-sectional view of the network communication device of FIG. 1A along a section line A-A.

FIG. 5A is a schematic cross-sectional view of the network communication device in FIG. 1A along a section line A-A. For the convenience of illustration, the size of some components in FIG. 5A is enlarged, but is not used to represent the actual size or the size proportion with other components. Please refer to FIG. 5A. In the embodiment of the disclosure, the network communication device 100 further includes an electromagnetic wave shielding cover 160. The electromagnetic wave shielding cover 160 is disposed on the first surface S1 and covering the network communication chip 120, so that electromagnetic waves of the network communication chip 120 is less likely to radiate outside the space formed by the first metal cover 140 and the circuit board 110, and can also avoid interfering other surrounding electronic components or being interfered by electromagnetic waves from the surrounding electronic components.

In an embodiment of the disclosure, the first metal cover 140 further has a heat dissipation portion 148a. The heat dissipation portion 148a is in thermal contact with the electromagnetic wave shielding cover 160 and the network communication chip 120. That is to say, the heat dissipated during the operation of the network communication chip 120 may be conducted to the heat dissipation portion 148a and the entire first metal cover 140, thereby maintaining the performance of the network communication chip 120 and avoiding damage to the network communication chip 120. In addition, a heat dissipation pad 170 may be provided between the network communication chip 120 and the electromagnetic wave shielding cover 160 and between the heat dissipation portion 148a and the electromagnetic wave shielding cover 160 to further improve the efficiency of heat conduction.

In addition, in the embodiment of the disclosure, the first surface S1 also has a bare metal layer 118, and the first metal cover 140 further has a heat dissipation portion 148b. The heat dissipation portion 148b is in thermal contact with the bare metal layer 118, and the bare metal layer 118 is electrically connected to the ground layer 112a. Such a design allows the heat on the circuit board 110 to be thermally conducted to the heat dissipation portion 148b and the entire first metal cover 140 through the bare metal layer 118, thereby maintaining the performance of components disposed on the circuit board 110. In addition, the heat dissipation pad 170 may also be provided between the heat dissipation portion 148b and the bare metal layer 118 to further improve the efficiency of heat conduction. The bare metal layer 118 may be formed together with the ground ring 112b and other lines on the circuit board 110. The bare metal layer 118 may be formed on the first surface S1 of the circuit board 110 in an area where no other components are disposed, and the position of the bare metal layer 118 may be opposite to positions disposed with heat-prone components on the second surface S2 of the circuit board 110, so as to efficiently dissipate heat from the heat-prone components.

It should be noted that the heat dissipation portion 148a and the heat dissipation portion 148b in this embodiment are part of the first metal cover 140. In other embodiments, the heat dissipation portion 148a and the heat dissipation portion 148b may also be external components that are in thermal contact with the first metal cover 140. In addition, the heat dissipation pad 170 may also be replaced by heat dissipation paste, heat conduction glue, or other materials or components that are easy to conduct heat, and the disclosure is not limited thereto.

Please refer to FIG. 1B and FIG. 2A. In the embodiment of the disclosure, the circuit board 110 further includes a connection port 116. A metal shell of the connection port 116 is in physical contact with and electrically connected to the annular support rib 142. The connection port 116 is electrically connected to the internal circuit of the circuit board 110 and the ground layer 112a. Through the above design, even if the ground ring 112b has an opening at the place where the connection port 116 is disposed on the circuit board 110, so that the ground ring 112b does not completely surround the circuit board 110, the circuit board 110 and the first metal cover 140 may still form a substantially complete shielding chamber.

In addition, the first metal cover 140 also has a through port 146. When the circuit board 110 is assembled on the first metal cover 140, the position of the connection port 116 corresponds to the through port 146 of the first metal cover 140, so that the user can still electrically connect external components to the circuit board 110 through the through port 146.

Figure 4:
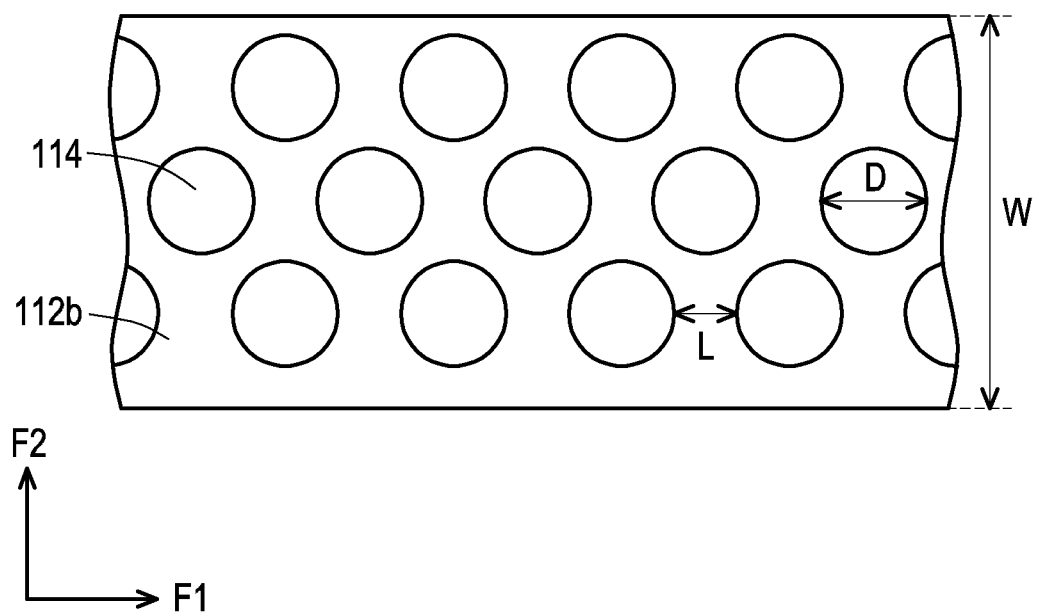
FIG. 4 is a partially enlarged view of a ground ring of the network communication device in FIG. 2A.

FIG. 4 is a partially enlarged view of a ground ring of the network communication device in FIG. 2A. Please refer to FIG. 4. In the embodiment of the disclosure, there are also a plurality of solder balls 114 arranged in a staggered manner on the ground ring 112b and connected to the ground ring 112b. In other words, the ground ring 112b of the circuit board 110 is in physical contact with and electrically connected to the annular support rib 142 of the first metal cover 140 through the plurality of solder balls 114. It should be noted that, for the clarity of the drawing, the plurality of solder balls 114 are not shown on the ground ring 112b in FIG. 2A.

The plurality of solder balls 114 are respectively arranged along a first direction F1 and a second direction F2. The first direction F1 is, for example, the extending direction of the ground ring 112b. The second direction F2 is perpendicular to the first direction F1, and the second direction F2 is, for example, parallel to the direction in which the network communication chip 120 emits electromagnetic waves outward. As shown in FIG. 4, looking along the second direction F2 parallel to the surface of the circuit board 110, another solder ball 114 is seen between the solder balls 114. In other words, when the network communication chip 120 emits electromagnetic waves outward, the electromagnetic waves touches at least one solder ball 114 and is received. Through the solder balls 114 arranged in a staggered manner on the ground ring 112b as described above, the electromagnetic waves emitted by the network communication chip 120 does not directly radiate outward from the gap between the ground ring 112b and the first metal cover 140 to affect the reception of the antenna 130. Experiments have proved that by designing diameters D of the solder balls 114 to respectively range from 11 mils to 13 mils, such as 12 mils, spacings L between the solder balls 114 to respectively range from 9 mils to 11 mils, such as 10 mils, and a width W of the ground ring 112b to be greater than or equal to 1.5 mm, electromagnetic waves emitted from the network communication chip 120 to outside the first metal cover 140 and the circuit board 110 can be reduced, and the reception of the antenna 130 is not affected.

Since the solder balls 114 are less likely to be oxidized than the ground ring 112b, after the solder balls 114 are melted on the ground ring 112b through reflow, the ground ring 112b may be stably electrically connected to the first metal cover 140 through the less likely to be oxidized solder balls 114. In addition, the solder ball 114 is not fixedly bonded to the annular support rib 142 of the first metal cover 140, and there is no interlocking structure between the annular support rib 142 and the circuit board 110, so the circuit board 110 can be easily assembled or disassembled from the first metal cover 140 repeatedly.

It should be noted that, although FIG. 4 only shows a part of the ground ring 112b and the solder balls 114 disposed thereon, the entire ground ring 112b is disposed with the solder balls 114 as shown in FIG. 4. In addition, the arrangement of the solder balls 114 is not limited to the arrangement shown in FIG. 4. For example, the solder balls 114 may be arranged in four or more rows parallel to the first direction F1. The shape of the solder ball 114 may be round, square, rhombus, or other shapes.

Please refer to FIG. 5A. The first metal cover 140 of this embodiment further has a retaining wall 144. The annular support rib 142 and a contact surface of the ground ring 112b are shielded by the retaining wall 144 when viewed along a direction F3 parallel to the first surface S1. As shown in FIG. 1A and FIG. 5A, when the circuit board 110 is assembled on the first metal cover 140, the retaining wall 144 completely surrounds the circuit board 110. Such a design makes it less likely for the electromagnetic waves emitted by the network communication chip 120 to enter or exit the shielding chamber jointly formed by the first metal cover 140 and the circuit board 110 to radiate from between the circuit board 110 and the first metal cover 140 to the outside.

In this embodiment, the retaining wall 144 is shown integrally disposed on the outer periphery of the first metal cover 140. In other embodiments of the disclosure, the retaining wall 144 may also be disposed inside the outer periphery of the first metal cover 140 according to the size of the circuit board 110, and the retaining wall 144 still completely surrounds the circuit board 110. Such a design makes it less likely for the electromagnetic waves emitted by the network communication chip 120 to enter or exit the shielding chamber jointly formed by the first metal cover 140 and the circuit board 110 to radiate from between the circuit board 110 and the first metal cover 140 to the outside.

Figure 5B:
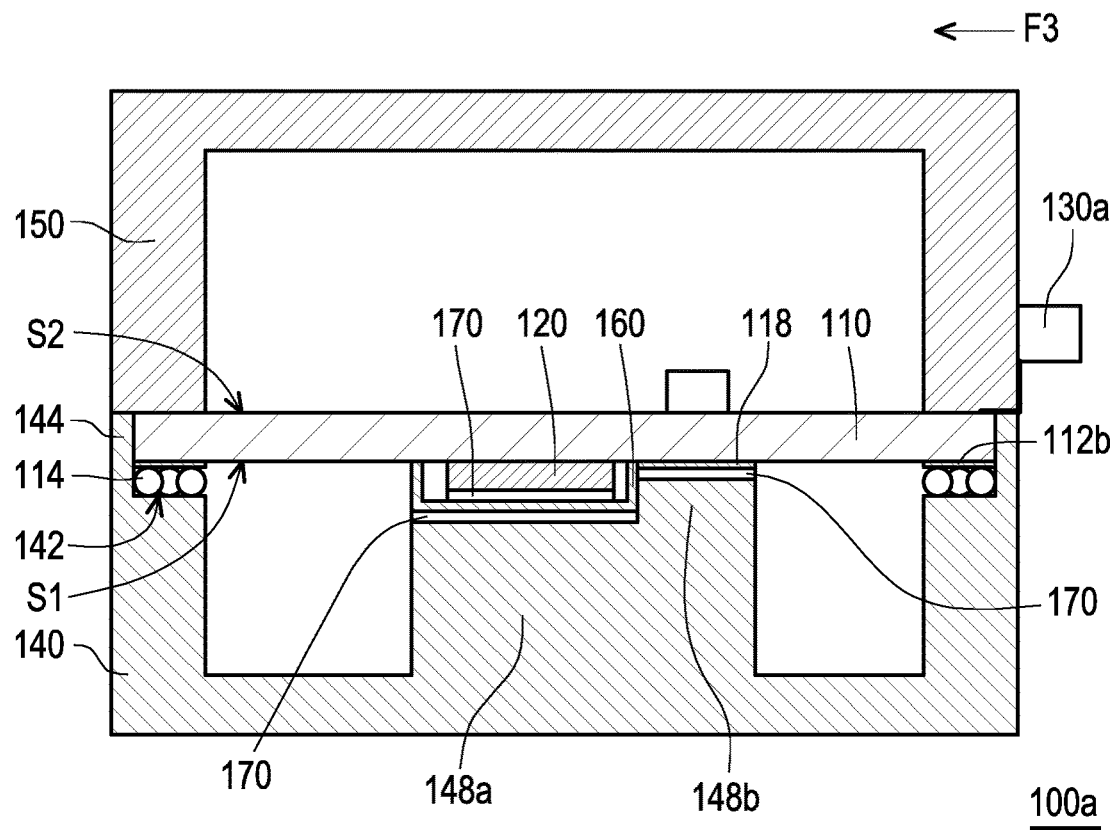
FIG. 5B is a schematic cross-sectional view of another embodiment of the disclosure.

FIG. 5B is a schematic cross-sectional view of another embodiment of the disclosure. Please refer to FIG. 5A and FIG. 5B. A network communication device 100a of this embodiment is substantially the same as the network communication device 100 of FIG. 5A. The difference between the two is that, the network communication device 100a of this embodiment further includes a second metal cover 150. The second metal cover 150 is assembled with the first metal cover 140, and the circuit board 110 is disposed between the first metal cover 140 and the second metal cover 150. Since the second metal cover 150 is also entirely made of metal, the shielding of the electromagnetic waves generated during the operation of the network communication chip 120 may be further strengthened. At this time, an antenna 130a is positioned outside the first metal cover 140 and the second metal cover 150.

Figure 5C:
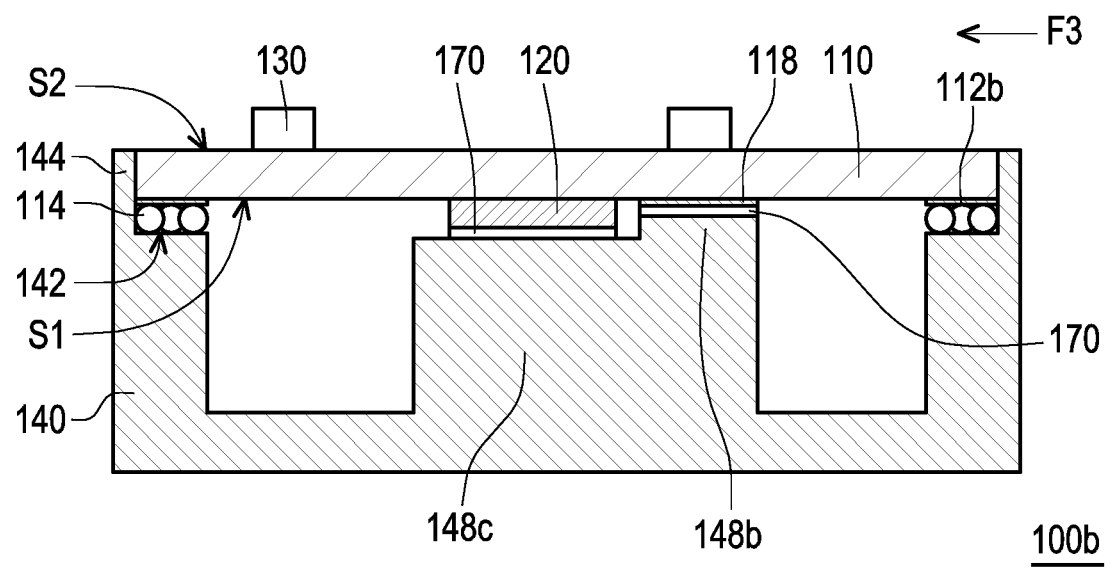
FIG. 5C is a schematic cross-sectional view of another embodiment of the disclosure.

FIG. 5C is a schematic cross-sectional view of another embodiment of the disclosure. Please refer to FIG. 5A and FIG. 5C. A network communication device 100b of this embodiment is substantially the same as the network communication device 100 shown in FIG. 5A. The difference between the two is that, the network communication device 100b of this embodiment does not adopt the electromagnetic wave shielding cover 160 to cover the network communication chip 120, but a heat dissipation portion 148c is in thermal contact with the network communication chip 120 through the heat dissipation pad 170, so as to improve the efficiency of heat conduction. In another embodiment of the disclosure, the network communication device 100 does not adopt the electromagnetic wave shielding cover 160 to cover the network communication chip 120, but the heat dissipation portion 148c is directly in thermal contact with the network communication chip 120, so as to improve the efficiency of heat conduction.

Based on the above, in the network communication device of the disclosure, the annular support rib of the first metal cover is electrically connected to the ground ring of the circuit board, so that the first metal cover and the circuit board can shield electromagnetic waves, so that the electromagnetic waves are less likely to enter or exit the chamber formed by the first metal cover and the circuit board. The retaining wall of the first metal cover and the solder ball on the ground ring can further shield electromagnetic waves. In addition, the circuit board is not fixedly bonded to the first metal cover, so that users can easily assemble or disassemble the circuit board from the first metal cover repeatedly.

Finally, it should be noted that the above embodiments are only used to illustrate the technical solutions of the disclosure, rather than to limit them. Although the disclosure has been described in detail with reference to the foregoing embodiments, persons skilled in the art should understand that the technical solutions described in the foregoing embodiments may still be modified, or some or all of the technical features may be equivalently replaced. However, the modifications or replacements do not make the essence of the corresponding technical solutions depart from the scope of the technical solutions of the embodiments of the disclosure.

What is claimed is:

1. A network communication device, comprising:
    a circuit board having a first surface and a second surface opposite to each other, wherein an interior of the circuit board has a ground layer, an edge of the first surface has a ground ring, and the ground ring surrounds the first surface and is electrically connected to the ground layer;
    a network communication chip disposed on the first surface;
    an antenna electrically connected to the circuit board;
    a first metal cover having an annular support rib, wherein the circuit board is disposed on the annular support rib with the first surface facing the first metal cover, and the ground ring is in physical contact with and electrically connected to the annular support rib; and
    an electromagnetic wave shielding cover disposed on the first surface and covering the network communication chip, the first metal cover further has a heat dissipation portion in thermal contact with the electromagnetic wave shielding cover.

2. The network communication device according to claim 1, wherein the first metal cover further has a retaining wall, and the annular support rib and a contact surface of the ground ring are shielded by the retaining wall when viewed along a direction parallel to the first surface.

3. The network communication device according to claim 1, further comprising a plurality of solder balls arranged in a staggered manner on the ground ring and connected to the ground ring.

4. The network communication device according to claim 3, wherein diameters of the plurality of solder balls respectively range from 11 mils to 13 mils, and spacings between the plurality of solder balls respectively range from 9 mils to 11 mils.

5. The network communication device according to claim 1, wherein the first metal cover further has a heat dissipation portion in thermal contact with the network communication chip.

6. The network communication device according to claim 1, further comprising a second metal cover assembled with the first metal cover, wherein the circuit board is disposed between the first metal cover and the second metal cover, and the antenna is positioned outside the first metal cover and the second metal cover.

7. The network communication device according to claim 6, wherein the first metal cover and the second metal cover are entirely made of metal.

8. The network communication device according to claim 1, wherein the ground layer is electrically connected to the ground ring through a plurality of plated through holes.

9. The network communication device according to claim 1, wherein the circuit board further comprises a connection port, and a metal shell of the connection port is in physical contact with and electrically connected to the annular support rib.

10. The network communication device according to claim 1, wherein the first surface also has a bare metal layer, the heat dissipation portion is in thermal contact with the bare metal layer, and the bare metal layer is electrically connected to the ground layer.

11. The network communication device according to claim 1, wherein a width of the ground ring is greater than or equal to 1.5 mm.

* * * * *